United States Patent
To et al.

(10) Patent No.: US 7,719,556 B2
(45) Date of Patent: *May 18, 2010

(54) METHOD AND APPARATUS FOR IMAGING WITH MULTIPLE EXPOSURE HEADS

(75) Inventors: Derrick Kevin To, Vancouver (CA); Calvin D. Cummings, Surrey (CA); Roland Wescott Montague, Vancouver (CA); Remy Dawson, Vancouver (CA); Guy Sirton, Delta (CA)

(73) Assignee: Kodak Graphic Communications Canada Company, Burnaby, British Columbia (CA)

( * ) Notice: Subject to any disclaimer, the term of this patent is extended or adjusted under 35 U.S.C. 154(b) by 40 days.

This patent is subject to a terminal disclaimer.

(21) Appl. No.: 11/755,204

(22) Filed: May 30, 2007

(65) Prior Publication Data

US 2007/0216751 A1 Sep. 20, 2007

Related U.S. Application Data

(63) Continuation of application No. 10/688,901, filed on Oct. 21, 2003, now Pat. No. 7,256,811.

(51) Int. Cl.
*B41J 2/435* (2006.01)
(52) U.S. Cl. .................................. 347/234; 347/248
(58) Field of Classification Search ............. 347/234, 347/229, 235, 248–250, 19, 20, 37; 400/82
See application file for complete search history.

(56) References Cited

U.S. PATENT DOCUMENTS

| | | | |
|---|---|---|---|
| 4,131,898 A | | 12/1978 | Gamblin |
| 4,576,490 A | * | 3/1986 | Isobe ..................... 400/82 |
| 5,359,434 A | | 10/1994 | Nakao et al. |
| 5,587,730 A | | 12/1996 | Karz |
| 5,749,662 A | * | 5/1998 | Shibasaki et al. ......... 400/82 |
| 5,795,689 A | | 8/1998 | Okamura et al. |
| 5,887,525 A | | 3/1999 | Okamura et al. |
| 5,934,195 A | | 8/1999 | Rinke et al. |
| 6,290,326 B1 | | 9/2001 | Hipp et al. |
| 6,938,969 B2 | | 9/2005 | Shibasaki |
| 7,256,811 B2 | * | 8/2007 | To et al. .................. 347/234 |

* cited by examiner

*Primary Examiner*—Hai C Pham
(74) *Attorney, Agent, or Firm*—Nelson Adrian Blish

(57) ABSTRACT

An imaging system is equipped with two or more exposure heads that are each able to image either a separate media sheet or a portion of a single media sheet loaded on a media carrier. The imaging time for any combination of media sheets is minimized by providing for the adjustment of the spacing between the dual exposure heads whenever the media configuration changes. In imaging a unitary image using two exposure heads to each image a sub-image, any discontinuity between the end of the first sub-image and the start of the next sub-image is reduced by changing the traversing speed of one of the exposure heads by a fractional amount.

33 Claims, 6 Drawing Sheets

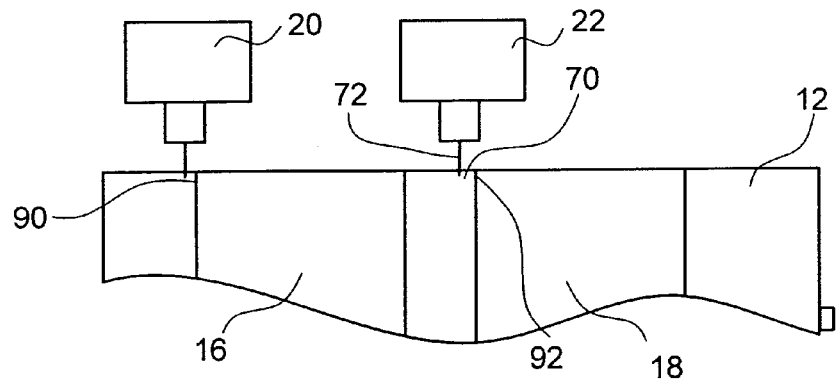
FIG. 5-A
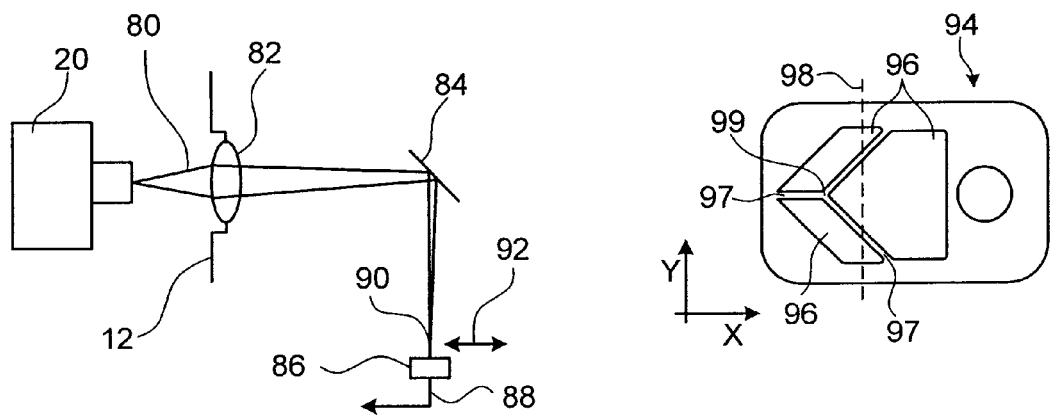
FIG. 5-B
FIG. 5-C
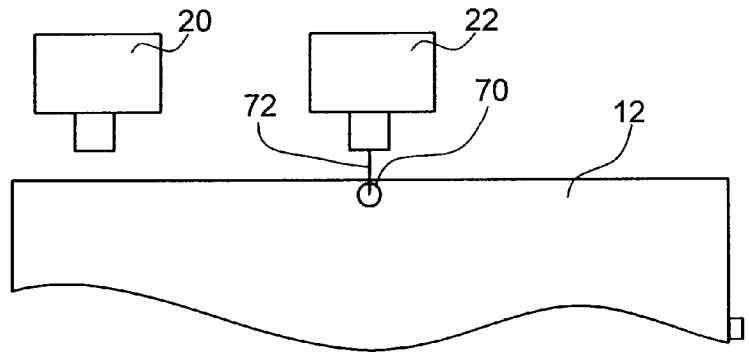
FIG. 5-D

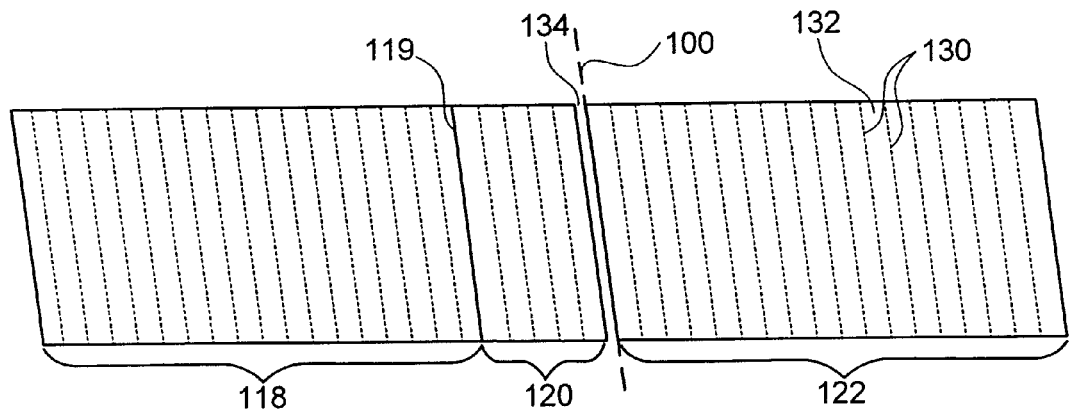
FIG. 8-A
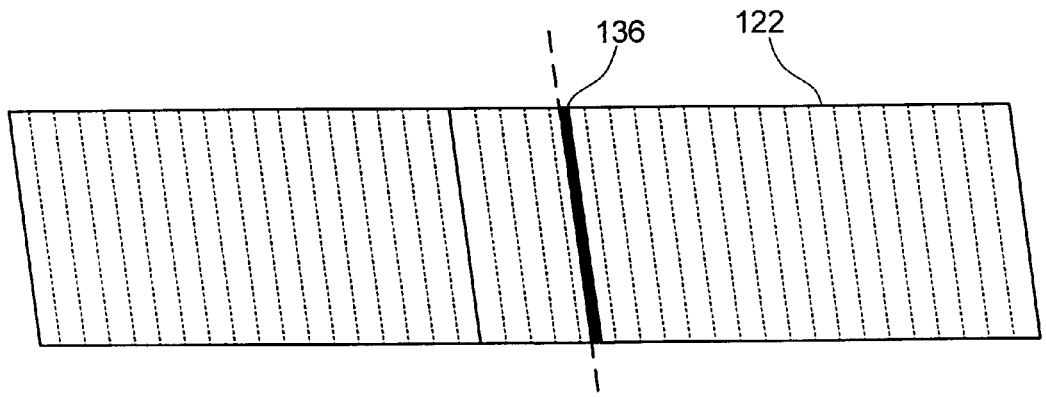
FIG. 8-B
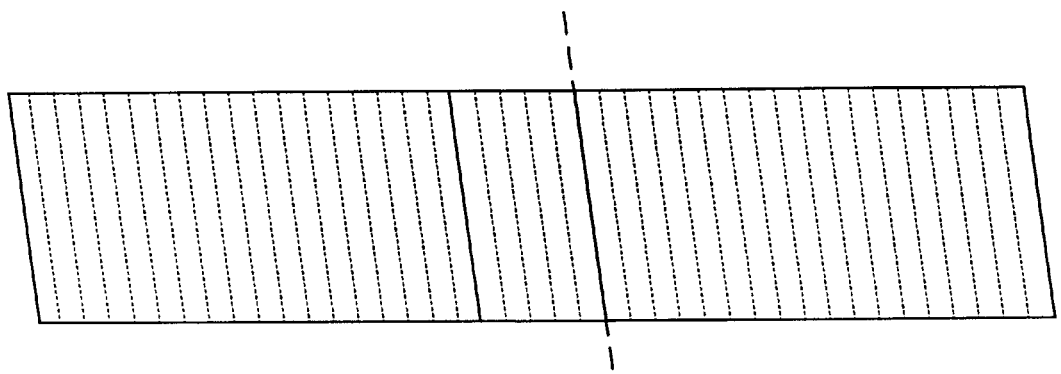
FIG. 8-C

METHOD AND APPARATUS FOR IMAGING WITH MULTIPLE EXPOSURE HEADS

CROSS REFERENCE TO RELATED APPLICATIONS

This is a continuation of application Ser. No. 10/688,901, filed Oct. 21, 2003 now U.S. Pat. No. 7,256,811.

FIELD OF THE INVENTION

The invention relates to imaging systems and more particularly to imaging systems which form an image on a recording media using multiple exposure heads.

BACKGROUND OF THE INVENTION

Imaging systems that are capable of imaging films, lithographic plates, flexographic plates, proofing materials and other media types are well known in the art. In the printing industry, laser based exposure heads are commonly used to form an image on a lithographic plate for subsequent use in a printing operation on a printing press. Some imaging systems are capable of printing on multiple media formats such as plates, films, and proofing media.

A common imaging system architecture provides an exposure head which generates one or more modulated beams or channels and an imaging media carrier for securing a media sheet. The beams are scanned over the media by a scanning means which produces relative motion between the media sheet and the beams. The scanning means may comprise, for example, an external drum, internal drum, or a flatbed scanning system. In an external drum system the media is held on a rotatable drum and the beams from the exposure head are scanned over the media surface by a combination of drum rotation and translation of the exposure head.

A common problem in the design of imaging systems is providing sufficient imaging speed to meet the media preparation requirements of the industry. Particularly in the printing industry, where a large capital investment in printing press equipment dictates that presses should be kept running at high duty cycles, the time taken to prepare a plate for press may be a limiting factor in the printer's overall workflow.

U.S. Pat. No. 5,887,525 to Okamura et al. describes a machine for simultaneously making two printing plates for newspaper printing. The machine has two exposure sections in series to speed up the production of plates for a newspaper press. In U.S. Pat. No. 5,795,689 to Okamura et al. the speed of a machine for making newspaper printing plates is increased by using two exposure heads in parallel to scan different areas of a plate, thus reducing the time taken to prepare a plate for use on the press. The exposure heads may each write images that are duplicates or the image written by each exposure head may be different.

U.S. Pat. No. 5,934,195 to Rinke et al. describes a flatbed system that is capable of simultaneously exposing two separate single-wide plates, each having the same or a different image thereon, or a single double-wide plate, each half of which has the same or a different image thereon.

There remains a need for better methods and apparatus for imaging with multiple exposure heads.

SUMMARY OF THE INVENTION

A first aspect of the invention provides an imaging apparatus comprising a media carrier and at least two exposure heads. Each exposure head is disposed to image a portion of a single sheet of media secured on the media carrier, or one of at least two sheets of media secured on the media carrier. An adjustable spacer is provided for moving the exposure heads relative to each other to change the spacing therebetween.

In another aspect of the present invention a method of imaging with at least two exposure heads is provided. The method comprises loading at least one sheet of media on a media carrier and adjusting the spacing between the exposure heads in accordance with the number and size of media loaded on the media carrier. A portion of a single sheet of media secured on the media carrier, or one of at least two sheets of media secured on the media carrier are then imaged by each exposure head.

In yet another aspect of the invention a method for aligning two exposure heads for imaging a unitary image on a media is provided. The unitary image is partitioned into two sub-images. The method comprises imaging a first test image with one of the exposure heads and imaging a second test image with the other exposure head, the second test image adjoining the first test image. The degree of misalignment between the exposure heads is determined by examining the adjoining portion between the test images. The traversing speed of at least one of the exposure heads is adjusted in accordance with the determined degree of misalignment.

For an understanding of the invention, reference will now be made by way of example to a following detailed description in conjunction with the accompanying drawings.

BRIEF DESCRIPTION OF THE DRAWINGS

In drawings which illustrate by way of example only preferred embodiments of the invention:

FIGS. 5-A to 5-D are views of various aligning systems;

FIGS. 8-A to 8-C are a series magnified views of a portion of the imaging media shown in FIG. 7;

DETAILED DESCRIPTION OF THE INVENTION

Figure 1:
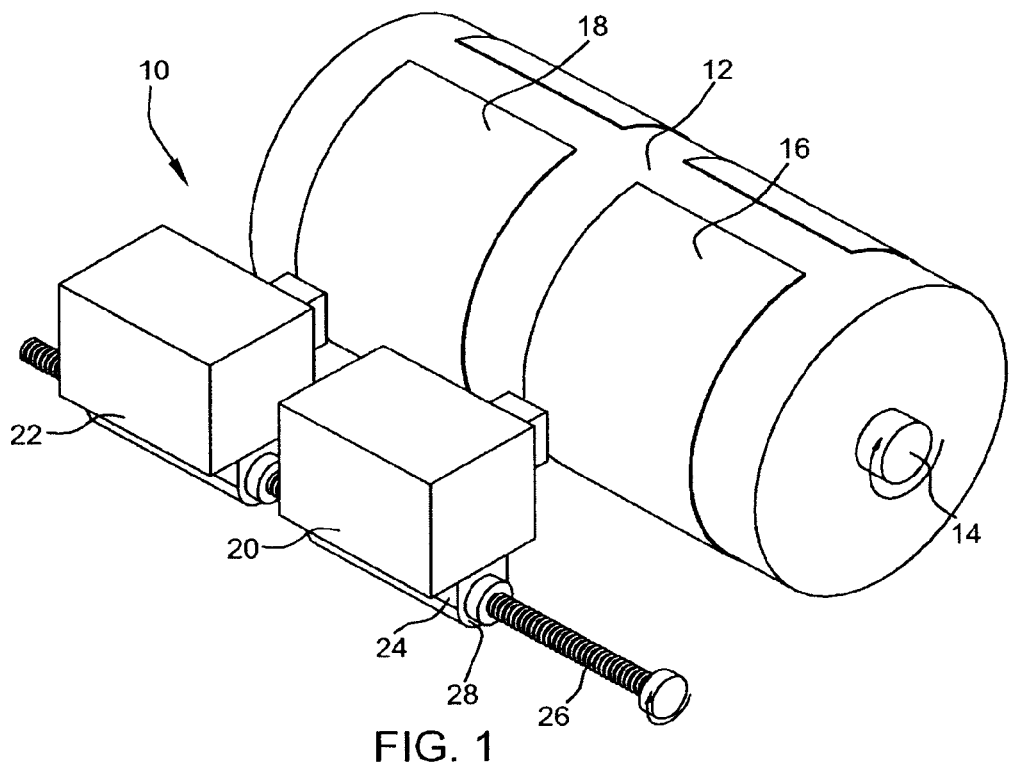
FIG. 1 is a perspective view of an imaging system for imaging two separate media sheets.

FIG. 1 shows an imaging engine 10 having a drum 12. Drum 12 is rotatable about a central axis 14. Two sheets of media 16 and 18 are secured on drum 12. A first exposure head 20 is disposed to image media sheet 16 and a second exposure head 22 is disposed to image media sheet 18. Exposure heads 20 and 22 are each attached to a corresponding carriage 24. Carriages 24 are traversed by rotating leadscrew 26, thus driving leadscrew nuts 28, which are attached to carriages 24.

Exposure heads 20 and 22 are independent imaging units, each responsive to separate data and control signals, but traversed by a common leadscrew 26. Leadscrew rotational drive is provided by a suitable motor (not shown) such as a stepper motor or a servo motor. The position of the exposure heads 20 and 22 along the length of the leadscrew 26 may be determined by keeping a count of the number of steps applied to the stepper motor in relation to a previously established home position. Alternatively, other well-known linear or rotary mechanisms and linear or rotary encoding techniques may be employed to translate and keep track of the lateral position of an exposure head.

Imaging engine 10 is capable of imaging a media in two different modes. In a first imaging mode shown in FIG. 1 exposure head 20 images media sheet 16 and exposure head 22 images media sheet 18. The images may be different or identical. In a second imaging mode shown in FIG. 2 each of the exposure heads 20 and 22 image a portion of a single large media sheet 40 loaded on drum 12. This reduces the imaging time over that which would be required if the media sheet 40 were to be imaged by a single exposure head.

In an alternative third mode of operation, the two or more exposure heads may be used to provide some redundancy. In the event of a failure of one of the exposure heads the imaging can be done by the other exposure head until the failed exposure head is replaced or repaired. The imaging time in this mode will be slower, but this represents a useful system reliability feature to a user who is severely impacted by downtime.

Figure 2:
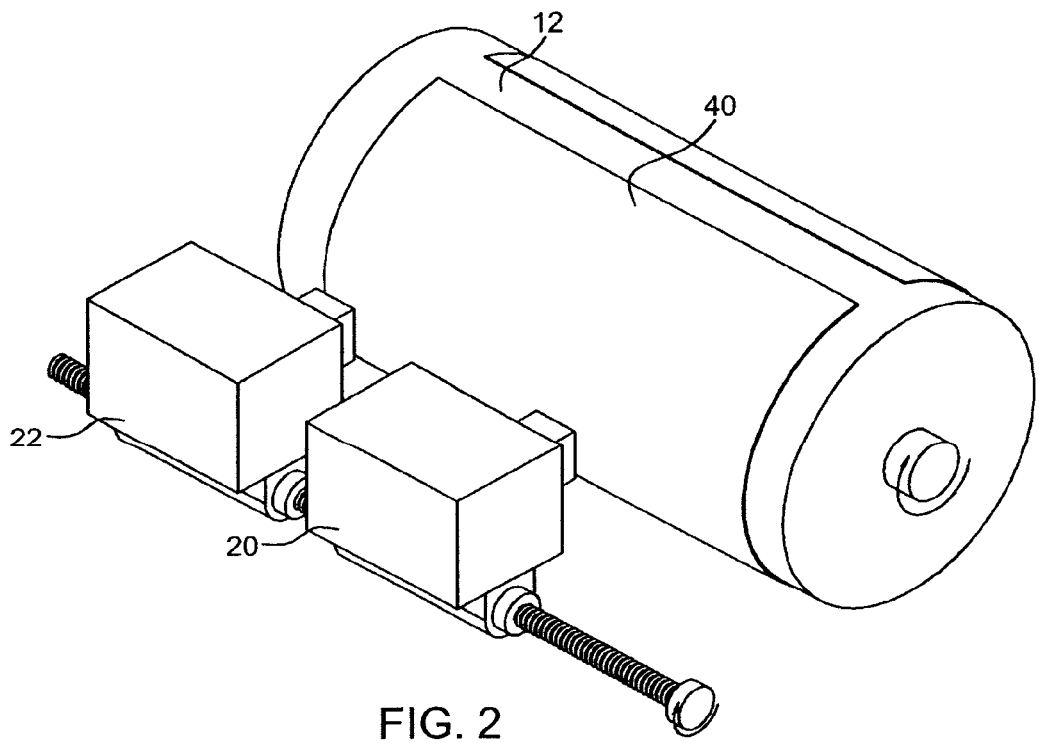
FIG. 2 is a perspective view of a system for imaging a single large media sheet.

In practice, there are some problems associated with the simple embodiments shown in FIG. 1 and FIG. 2 in that the spacing between the exposure heads 20 and 22 is fixed by leadscrew 26. For a specific head spacing imaging speed is only maximized when imaging a media that has a width approximately twice the spacing between heads (for one large sized sheet or two smaller sheets, each smaller sheet approximately half the size of the large sheet). Any other sizes of media sheet will generally have less-than-optimal imaging times.

Another problem occurs when imaging a unitary image on a single large media sheet, with each exposure head imaging a portion of the unitary image. The line along which the two image portions join (the "stitch line") will generally show some discontinuity unless the two exposure heads are very precisely spaced. The spacing may drift with time and environmental conditions making it necessary to periodically re-space the heads.

Figure 3:
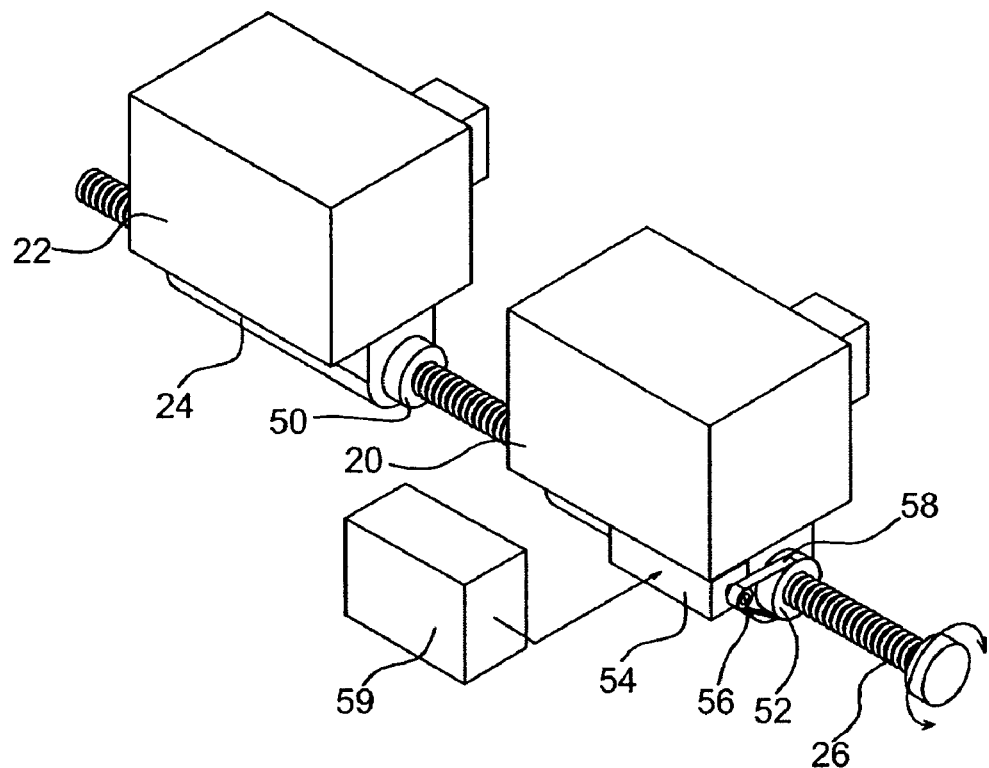
FIG. 3 is a perspective view of a pair of exposure heads on a common leadscrew.

In an embodiment of the invention shown in FIG. 3, exposure heads 20 and 22 are traversed on a common leadscrew 26. Exposure head 22 has a fixed leadscrew nut 50 while exposure head 20 has a rotatable leadscrew nut 52. Nut 52 is connected to exposure head 20 via a bearing (not shown) allowing nut 52 to rotate freely while simultaneously preventing any relative longitudinal motion between the nut 52 and exposure head 20. Exposure head 20 is additionally equipped with an auxiliary drive motor 54 which may be a stepper motor. Auxiliary motor 54 provides rotational drive to nut 52 via a pulley 56 driving a belt 58. The spacing between heads 20 and 22 can be adjusted by rotating nut 52 in response to control signals from a motor controller 59.

The adjustment will generally be made before or after an imaging operation and may advantageously be executed during a retrace cycle while the exposure heads are returning to a home position on completion of an image. The adjustment is preferably performed automatically in response to a control signal from controller 59 but this is not mandated and some of the benefits of the invention may be realized in a manually adjusted system.

Figure 4:
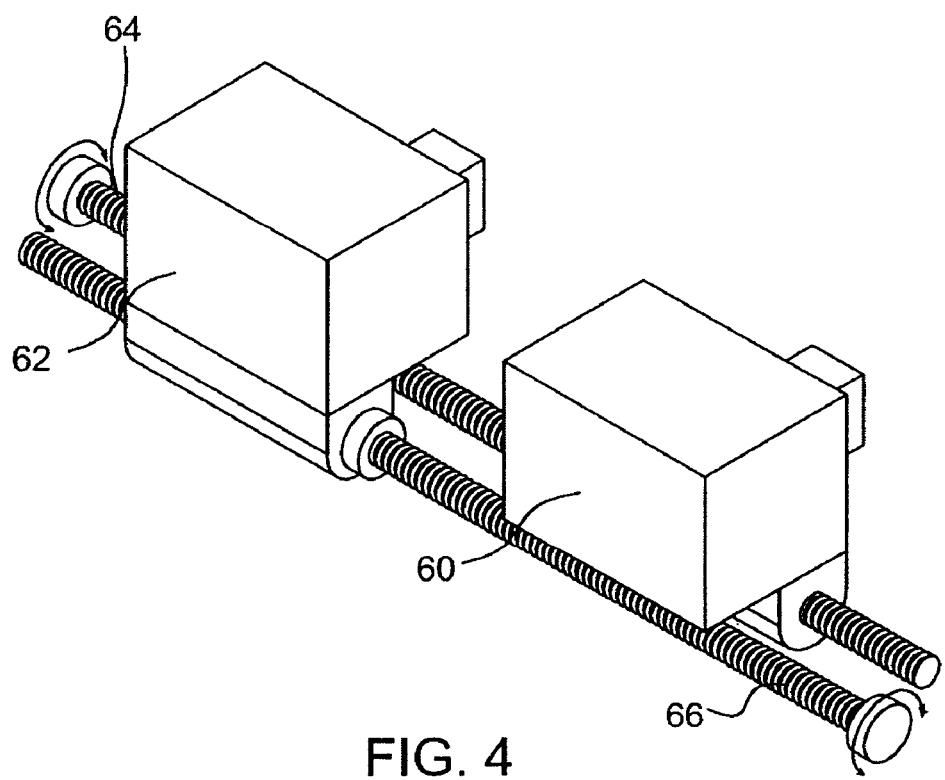
FIG. 4 is a perspective view of a pair of exposure heads each on an independent leadscrew.

As may be appreciated by a person skilled in the art, many other mechanisms for driving nut 52 may be employed to effect the adjustment. Other mechanisms for adjusting the spacing between exposure heads 20 and 22 may also be provided instead of, or in addition to, a nut 52 which is rotatable relative to its carriage 24. For example, the adjustment between nut 52 and exposure head 20 may be provided by a separate translation stage, such as a secondary leadscrew or other linear translation stage employed to move exposure head 20 relative to nut 52. In the embodiment shown in FIG. 3, the main traversing drive is still provided by leadscrew 26. Alternatively it is also possible to provide rotational drive to both nuts 50 and 52, while holding leadscrew 26 stationary. In another alternative embodiment shown in FIG. 4, a pair of exposure heads 60 and 62 are each independently driven by leadscrews 64 and 66. The drive to leadscrews 64 and 66 is provided by separate motors (not shown). The separate motors may nevertheless be synchronized to operate from a common system synchronization clock (which may also be used to control drum rotation). Conveniently, stepper motors may be used for the leadscrew drive since they allow both precise stepping and control, but any other suitable type of motor or motor/encoder combination may also be used.

In another alternative embodiment, only one of the exposure heads is driven by the leadscrew. The other exposure head is coupled to the first exposure head via a coupling to space them apart. The second head moves in tandem with the first. The spacing between heads is adjusted by varying the length of the coupling. In one embodiment the coupling comprises a bar having a length which can be varied by heating or cooling the coupling bar to thermally expand or contract it. The spacing is accurately maintained by controlling the temperature of the bar. A heater controlled by a controller (not shown) may be used to control the length of the coupling bar. Thermal adjustment provides very fine control of the spacing and a fixed bar provides a rigid connection between exposure heads removing any leadscrew effects from the spacing.

In a method according to the invention the imaging operation comprises the following steps:

(a) determining the format of the loaded media—e.g. a single media sheet or a pair of media sheets;

(b) adjusting the spacing between the exposure heads to correspond to either half the width of the single media sheet or to align with the spacing between a pair of media sheets, depending upon which format is present; and, (c) imaging either the single media sheet, with each exposure head imaging approximately half of the media sheet, or a pair of media sheets with each exposure head imaging one of the sheets. If there are more than two exposure heads then, for printing on a single media sheet, the exposure heads may be space apart by 1/0 times the width of the media sheet, where 0 is the number of exposure heads.

Advantageously, by adjusting the spacing between two exposure heads in accordance with the size of the media being imaged, the overall imaging time is reduced for any combination of media.

In the case where two or more separate media are imaged, each with a separate exposure head, the adjustment between the exposure heads need not be particularly precise. Many imaging systems have edge detection hardware for detecting the edge of the media sheet, optically or otherwise. One common optical edge detection method senses the discontinuity in surface reflectivity between the media and the drum surface. A precision of roughly 5:m can be achieved, which is quite adequate for most printing. In FIG. 5-A, media sheets 16 and 18 are secured on drum 12. Each of exposure heads 20 and 22 are equipped with an edge detection beam 72. The exposure heads 20 and 22 are traversed over the edges 90 and 92, and the edge locations recorded. The imaging data may then be arranged such that each image is correctly located on the media 16 and 18.

In the case where each exposure head images a portion of a single media sheet the spacing between exposure heads should be more precisely adjusted to avoid a visible discontinuity between the joined image portions. Simple edge detection may not be sufficiently accurate for other than low resolution imaging. It has been found that even errors of around ⅕th of a pixel may be discernable on some sensitive media. At 2400 dpi this translates into a sensitivity of around 2:m, which is an almost impossible accuracy to hold through mechanical tolerancing alone. A practical approach is to periodically align each exposure head to a target located on the drum. FIG. 5-D shows a drum 12 with a target 70 positioned at a fixed location on the surface of drum 12. The target provides a common alignment point for each of the exposure heads 20 and 22. Exposure head 22 is shown with an auxiliary beam 72 impinging on target 70. By first aligning exposure head 22 to target 70, and then moving exposure head 20 to align with target 70, the spacing between the exposure heads may be determined and adjusted. Alternatively, the imaging heads could be aligned to separate targets, spaced a known distance apart, albeit with potentially lower accuracy.

One specific embodiment of the target is shown in FIG. 5-B. Beam 80 from exposure head 20 is directed towards lens 82. Lens 82 is recessed into the surface of drum 12. The light gathered by lens 82 is directed to a position sensitive detector (PSD) 86 via mirror 84. PSD 86 generates a signal 88 responsive to the position of a beam 90 on the sensitive area of the PSD 86 and is able to indicate movement of the beam 90 in the direction of arrow 92. Lens 82 magnifies the displacement to increase the sensitivity of the target thus amplifying the motion 92 occurring at the surface of PSD 86.

In an alternative embodiment shown in FIG. 5-C, a target 94 has non-reflective areas 96 and reflective areas 97. Reflective areas 97 are located in the shape of a "Y" (on its side). The geometry of the reflective target 94 and specifically the angle between the "Y" branches is accurately determined prior to installing the target. A suitable target 94 may be constructed from a thin sheet of stainless steel using a lithography and chemical etching process to pattern the "Y" shape, guaranteeing a precise, known, geometry. Alternately the target may be separately characterized using well known measuring techniques.

In operation an auxiliary laser beam from the imaging head 20 or 22 is scanned over target 94 along line 98, the laser beam traversing two branches of the "Y" in succession. The reflection of the laser beam from the target 94 is monitored by a light sensor such as a photodiode (not shown) that converts the light intensity reaching the light sensor into an electrical signal. As each reflective branch of the "Y" target is traversed, the light sensor signal changes sharply defining a transition from non-reflective area 96 to reflective area 97 and back again to non-reflective area 96. The signal from the light sensor representing this transition is used to precisely determine the location of the Y branch.

Advantageously target 94 allows both X and Y co-ordinates of the laser beam to be simultaneously determined in a single traversing of the target along direction 98. The Y co-ordinate is determined as the half way point between the encoder readings at the two signal transitions. The X co-ordinate is determined from the following formula:

$$X' = \frac{d}{2} \cdot \tan\left(\frac{\theta}{2}\right)$$

where X' is the X displacement of the beam (at line 98) from intersection point 99 of the two branches of the "Y", d is the distance between the signal transitions, and □ is the angle between the branches of the Y. For □=90E the tan term equates to 1 and X'=d/2.

Alternatively, the target 94 may be viewed by a video camera. The resulting image is analyzed using pattern matching software (systems that include a video camera and pattern matching software are available, for example from Cognex Corp, USA).

Advantageously, it is not necessary for the beam to traverse the reflector target at any specific location, as long is it traverses both branches of the "Y". The third branch of the "Y", is used in as a convenient Y co-ordinate determination when there is no need for an X co-ordinate determination. It should be readily appreciated that the target may also be constructed from two angled reflective lines, not necessarily intersecting and not necessarily oriented as shown.

In some high resolution imaging systems, a discontinuity may still occur at the join between the two sub-images of a unitary image imaged on a single media sheet, even when the exposure heads are precisely spaced. For the best results it may be more practical to do a final fine adjustment based on inspection of a test pattern imaged on the media. In the embodiment shown in FIG. 2 the beam (or beams) from exposure heads 20 and 22 are scanned over the media 40 by simultaneously rotating drum 12 while translating exposure heads 20 and 22, each exposure head thus circumscribing a helical pattern around the drum. The discontinuity may be caused by a simple displacement between the end of one sub-image and the start of the other sub-image, or it may be caused by slight differences between the imaging beams that write the image in the adjoining area. A discontinuity is more likely to be apparent when imaging at high resolution. Another factor that influences the appearance of the discontinuity is the media. Some media are more likely to reveal or accentuate imaging artifacts than others.

Figure 6:
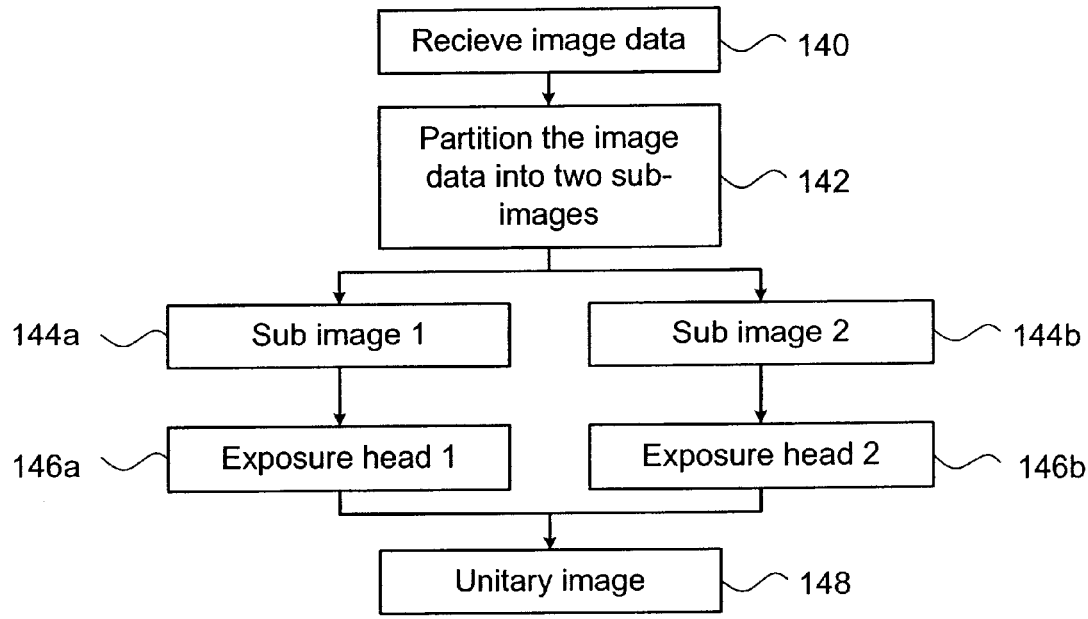
FIG. 6 is a process flowchart depicting a method of the present invention.

FIG. 6 is a flowchart depicting of a method for imaging a unitary image on a media with two exposure heads. Data defining a unitary image is received in step 140. In step 142, the data is partitioned to define two sub images 144a and 144b. The unitary image data file is split into two independent files, each containing a sub-image 144a or 144b. Each of the sub-images 144a and 144b are sent to a corresponding exposure head in step 146a and 146b. Preferably, each exposure head will image approximately 50% of the image but this is not mandated.

In step 148 the sub-images are imaged on a single media sheet to form a unitary image on the media. It should be evident that the goal is that there should be no easily discernable difference between an image written by two or more exposure heads and an image written conventionally by a single exposure head.

Figure 7:
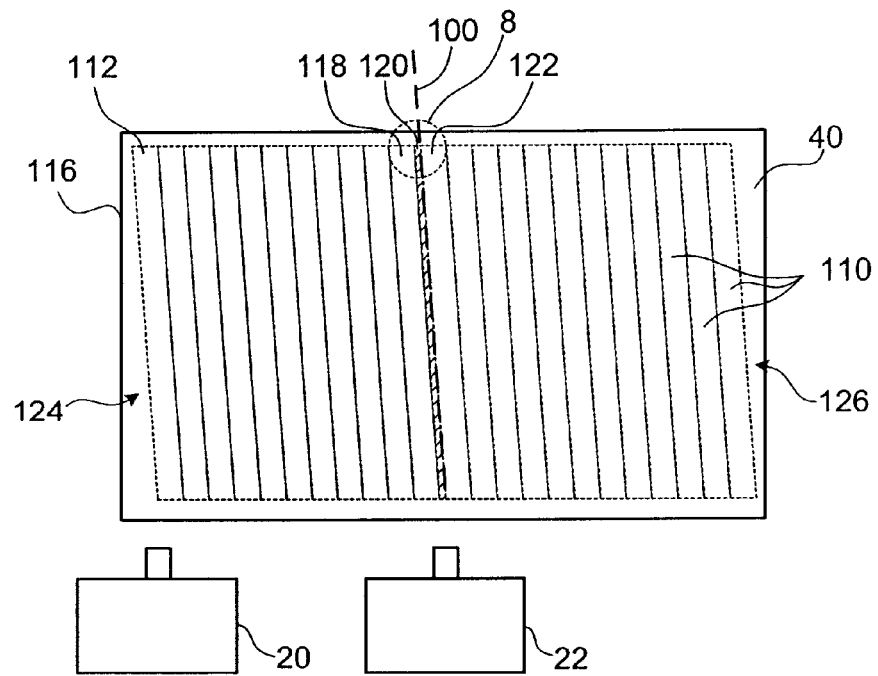
FIG. 7 is a schematic view of an imaging media and the relative positioning of the exposure heads.

FIG. 7 depicts an imaging media 40 that has been imaged by exposure heads 20 and 22. As previously described the scanning action may produce a series of slanted helical bands 110 across the imaging media. Each band may be a few mm in width or more and is imaged by a number of parallel independent beams or channels. It is well known in the art to re-arrange the data transmitted to the exposure head to ensure that, while the imaging bands may be tilted by some angle to the edge 116 of the media 40, the actual image imparted is orthogonal to the imaging media.

The first exposure head 20 starts imaging sub-image 124 at band 112. The second exposure head 22 starts imaging sub-image 126 at band 122. If it is required to image right to the edge 116 of the imaging media 40, band 112 may also span across the edge 116 of imaging media 40. The last full width band imaged by the exposure head 20 is band 118. The sub-images 124 and 126 are divided along line 100 according to the previously described partition point in the unitary image. Line 100 may be called a stitch line or a stitch. Since line 100 may not have been chosen exactly at the end of full band 118, exposure head 20 may be required to image partial band 120 in order to complete the first sub-image. When partial band 120 is being imaged by exposure head 20, band 122 has already been imaged by exposure head 22. The partial band 120 must be precisely aligned with band 122 to avoid the appearance of a discontinuity at the boundary therebetween.

In order to align the end of partial band 120 with the beginning of band 122 it is necessary to calculate how many individual beam widths are in the first sub-image 124, and then arrange for exposure head 20 to plot a pre-determined number of full bands, followed by a partial band with the last imaged beam being close to, but not necessarily overlapping, the beginning of band 122. Since the minimum width that can be imaged is an individual beam width, the alignment will generally be in error by less than one individual beam width. Unfortunately, at higher resolutions and for some imaging media types an error of a single beam width or less may be clearly apparent as a discontinuity in the resulting image.

This effect is further explained with reference to FIGS. 8-A to 8-C, which are magnified views of region 8 indicated in FIG. 7. In FIG. 8-A the last full band 118 and the partial band 120 of sub-image 124 are shown, as is the first band 122 of the second sub-image 126. The end of band 118 joins partial band 120 along line 119. Lines 130 do not define the bands but rather define the extents of individual imaging beams 132. Each band comprises a plurality of such individual imaging beams 132. The gap indicated at 134, which is smaller than the width of individual beam 132, results from not imaging an individual beam over the gap 134. If an individual beam were written in gap 134 it would also overlap the beginning of band 122. This situation is depicted in FIG. 8-B where the beginning of band 122 has been overwritten. This is shown schematically as a dark line 136, which results from the double exposure. In the cases shown in FIG. 8-A and FIG. 8-B the discontinuity may be discernable. The size of the gap 134 or the overwritten portion 136 can always be arranged to be less than the width of one individual imaging beam, since if the gap were more than this width it would be a simple matter to write one more individual beam to reduce the width of gap 134. In this way, the misalignment may be always restricted to an individual beam width or less.

This remaining misalignment cannot be easily corrected since imaging occurs on a pixel-by-pixel basis, the pixel being the minimum addressable element defined by an individual imaging beam 132. Returning to FIG. 7 it should readily be appreciated that the spacing between adjacent bands 110 is determined by the speed of translation of exposure heads 20 and 22. This is usually adjusted so that no separation between the bands is evident when the individual beams are correctly spaced for the chosen imaging resolution. The ability of an imaging engine to produce such a geometrically accurate image is important, particularly in the printing industry, where color separations must be accurately registered to print properly. The required registration accuracy may vary for different printing presses and printing resolutions. At 1200 dpi an accuracy of around 30:m is generally sufficient. At this resolution individual beams having widths of approximately 20:m are typically used. By fractionally increasing or decreasing the speed of translation of exposure heads 20 and 22, the gap 134 or overwritten portion 136 shown in FIGS. 8-A and 8-B may be effectively eliminated. The fractional increase in speed need only account for the width of an individual beam or less. Consequently, the effect on the geometric accuracy of the final image is negligible. The spacing between adjacent bands is affected by only a very small amount.

As an example, considering a 22-inch wide plate where each of the sub-images are 11 inches wide, at 1200 dpi there would be approximately 13,200 individual beam widths in each sub image. For an exposure head with 240 parallel channels, this corresponds to 55 bands. The maximum correction required for eliminating the gap or dark band at the stitch is 20:m (one individual beam width or less). This corresponds to an adjustment of 0.36:m at each band or a speed change of ∀ 0.007%, which is undiscernible from band-to-band but corrects for the discontinuity at the adjoining area.

Figure 9:
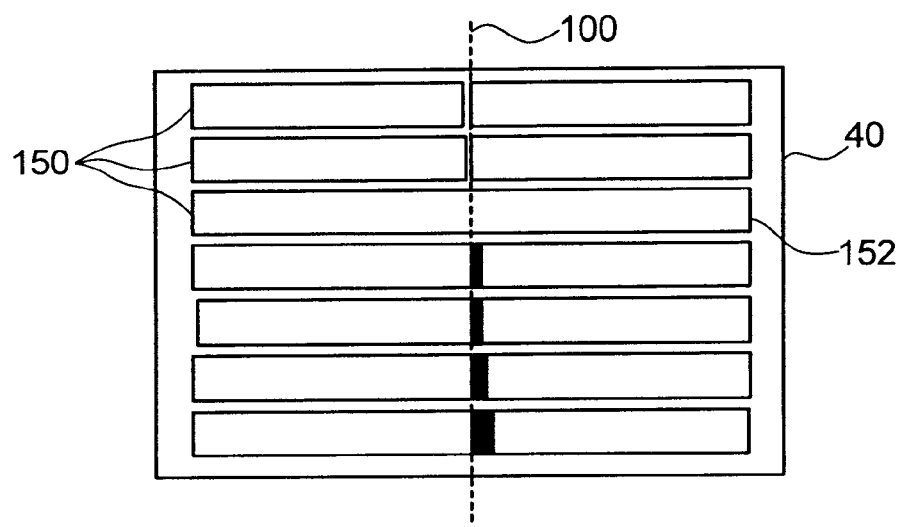
FIG. 9 is a schematic diagram showing a test image for aligning two exposure heads.

In practice, the actual speed change required may be determined empirically by writing a number of images on one or more imaging media sheets, each with successive small changes in speed of translation. The speed that produces the least visible discontinuity is chosen for use in subsequent imaging operations. Advantageously, as shown in FIG. 9, a single sheet of imaging media 40 may be imaged with a test set comprising a plurality of test strips 150 made at different speeds of translation. The test strip 152 with the least visible discontinuity near line 100 indicates the optimal translation speed. This process has the added advantage that if there is some difference between the beams produced by exposure heads 20 and 22, this difference may at the same time be at least partially corrected by the choice of the visually best image in the test set shown in FIG. 9.

Figure 10:
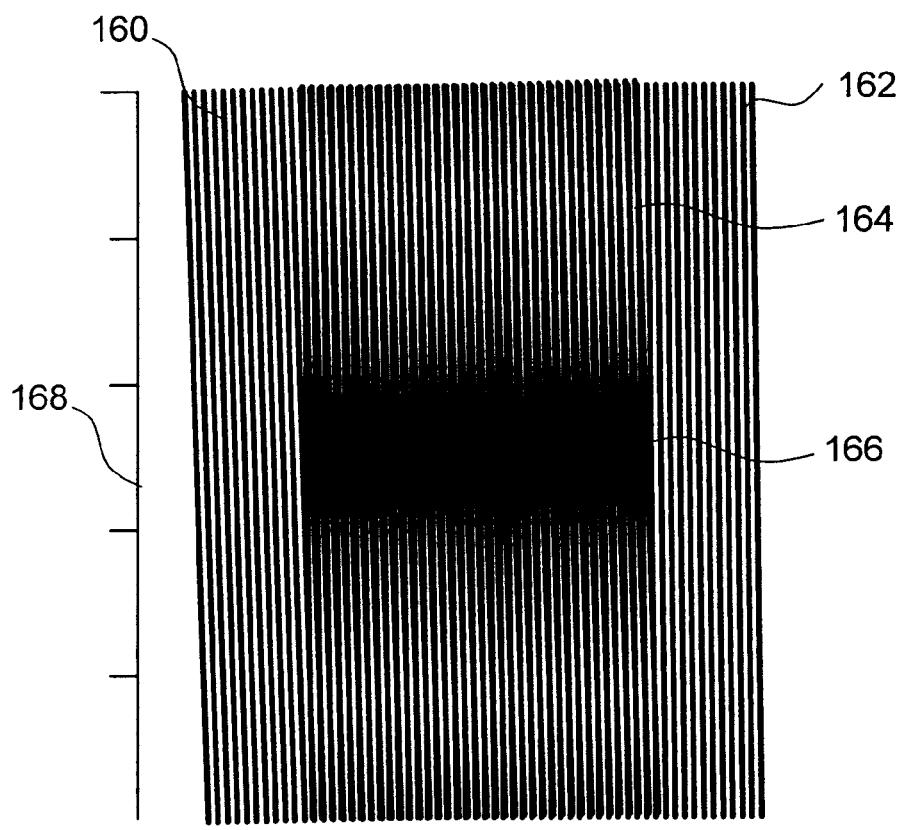
FIG. 10 is a simulated moiré pattern illustrating one specific alignment method according to the invention.

Another method for determining the required speed change is to deliberately overwrite a set of vertical lines from each exposure head. The resulting moiré interference pattern may be examined to determine the required speed change. This method is explained with reference to FIG. 10, which shows a first set of lines 160 imaged at a small angle to a second set of lines 162. In the depicted example the lines are imaged using an imaging system of the type that effects a helical scanning of the drum. The first set of lines 160 are imaged by the first exposure head and the second set of lines 162 by the second exposure head. The small angle between the lines may be introduced by disabling a number of channels on one of the exposure heads. This changes the helix angle for that head as the traversing speed is automatically increased by the system to compensate for having fewer imaging channels. The two sets of lines 160 and 162, offset at a small angle to each other, will produce a moiré pattern as shown in FIG. 10. For the situation where the pitch between the lines and the angle between the sets of lines is known, as is the case here, the position of the dark band or fringe 166 is indicative of the misalignment between the two patterns and thus the offset between the two exposure heads. Advantageously a scale 168 may be imaged alongside the sets of lines so that the spacing can be directly read off the imaging media at the location of fringe 166. Alternatively, the position of the light fringe 164 may be used to calculate the offset. As will be readily apparent to a person of skill in the art the use of lines to generate moiré patterns is convenient but not mandated. Any repetitive feature will create a moiré pattern that is usable for the purposes of the method described. For example, a plurality of dots in a regular grid when overlapped with another plurality of dots on a regular grid will also produce a moiré pattern.

Once accomplished, the adjustment may be susceptible to drift due to changes in the environmental temperature. Many imaging systems use a steel leadscrew for advancing the exposure heads, the steel having an expansion coefficient of around 12 ppm/EC. For a 500 mm distance between exposure heads the leadscrew will thus expand or contract by ~12:m for every 2EC change in temperature. Such a minor change in environmental conditions would have the effect of completely negating the alignment. The change may be accommodated by precisely measuring the temperature of the leadscrew and adjusting the scanning speed to compensate for any changes. The temperature measurement may need to take account of temperature gradients in the imaging system and will possibly require two or more temperature measurements at different points along the leadscrew. Alternatively, the expansion of the leadscrew with respect to the frame supporting the engine may be measured directly using a measuring device such as a Linear Variable Displacement Transducer (LVDT). The drum, leadscrew and carriage ways are typically all held in a frame, which may be of a different material than the leadscrew. It is particularly important to measure the difference between the expansion of the frame and the leadscrew. Thus an LVDT or the like attached to the frame at the floating end of the leadscrew and contacting the end thereof is ideally disposed to measure the quantity of interest.

Another factor that may affect the alignment is the pointing stability of the imaging beams produced by the exposure heads. The pointing direction is typically a property of the optical systems used to form the imaging beams. In some instances, it may be necessary to provide intermittent or continuous monitoring and adjustment of the beam pointing to ensure that the image-to-image alignment is maintained for a reasonable time.

Yet another factor that may need to be taken into account is the overall scaling of the images. Many imaging systems are carefully adjusted to provide accurately scaled images by imaging and measuring test images on an XY measuring table or the like. Scaling factors are calculated and applied to the imaging system as a machine calibration. It should be understood that such a calibration and the alignment of the images will generally be interrelated and will need to be performed together so that images are aligned and appropriately scaled.

There may also be a requirement to duplicate a portion of the data in the region of the partition point to deliberately overlap the images at the partition point. This need arises in the imaging of some types of media wherein adjacent bands are commonly overlapped by one or more beam widths. This feature is particularly useful for some types of thermally sensitive imaging media where subsequent exposures are not additive. Overlapping has been found to even out the boundaries between adjacent bands. Overlapping may also be useful in aligning sub-images produced by different exposure heads. The overlapped data is a repeat of the previously written data and writing may occur at full beam power or at reduced beam power. The duplication of the data is preferably taken into account when partitioning the image file into sub-images.

Although the foregoing discussion has been focused on a specific embodiment of an imaging engine the method may be applied to a wide range of imaging architectures where it is desired to write a single image with two or more exposure heads. Where the exposure heads share a common translation means the same translation speed change is applied to both exposure heads equally, thus limiting the correction to being performed with two such exposure heads. However, where the exposure heads are independently translated the invention may be applied to systems having two or more exposure heads. Similarly the method is also applicable to the situation where the distance between exposure heads is not adjustable, in which case the size of the imaging media and/or the size of the image to be written will determine the proportion of the image to be written by each exposure head.

The method is also applicable to other imaging architectures such as internal drum systems and flatbed systems. In such cases, while the scanning may be different the requirement still exists to stitch together two or more sub-images and as such, the translation speed may be altered in the manner described to reduce the appearance of the discontinuity.

The data partitioning may be achieved in a variety of different ways depending on the data format and the configuration of the system. For example instead of splitting the image into two separate sub-image files, a pointer may be used to indicate the point of partition between the two sub-images. It should also be understood that other formatting steps may follow the partitioning step.

It should also be noted that other methods of scanning beams across an imaging media are well known. One example of an alternative scanning method is to image a circumferential band while the exposure head is held stationary, whereafter the exposure head is indexed to a new position to image the next circumferential band. During the indexing operation the imaging ceases until the exposure head is in position to image another circumferential band, lined up alongside the previous one. While the invention has been described in relation to a helical scanning system, it is also applicable to other scanning methods employed in the industry.

As will be apparent to those skilled in the art in light of the foregoing disclosure, many alterations and modifications are possible in the practice of this invention without departing from the spirit or scope thereof.

The invention claimed is:

1. An imaging apparatus comprising:
a media carrier;
at least two exposure heads spaced apart from one another, each exposure head disposed to image a portion of a single sheet of media secured on the media carrier; and
an adjustable mechanism for moving the exposure heads at different traverse speeds relative to each other while the exposure heads we concurrently imaging the corresponding portions of the media.

2. The imaging apparatus of claim 1 wherein the exposure heads are disposed to image the media secured on the media carrier by directing imaging beams towards the media.

3. The imaging apparatus of claim 1 wherein the adjustable mechanism moves the exposure heads relative to each other to change a spacing therebetween while the exposure head are directing imaging beams towards the corresponding portions of the singe sheet of media secured on the media carrier.

4. An imaging apparatus comprising:
a media carrier;
a plurality of exposure heads spaced apart from one another, each exposure head disposed to image corresponding portions of media supported on the media carrier;
a mechanism for moving the exposure beads; and
a controller for adjusting a traverse speed of at least one exposure head to change a spacing between the exposure heads while the exposure heads are concurrently imaging the corresponding portions of the media supported on the media carrier.

5. The imaging apparatus of claim 4 wherein the each exposure head is disposed to image a portion of a single sheet of media supported on the media carrier.

6. The imaging apparatus of claim 4 wherein each exposure head is disposed to image one of at least two sheets of media supported on the media carrier.

7. The imaging apparatus of claim 4 wherein the exposure heads are disposed to image the corresponding portions of the media supported on the media carrier by directing imaging beams towards the media.

8. The imaging apparatus of claim 4 wherein the mechanism moves the exposure heads along a traversing direction, and the controller adjusts the traverse speed of the at least one exposure head to change the spacing between the exposure heads along the traversing direction.

9. The imaging apparatus of claim 4 wherein the mechanism moves the at least one exposure head along a traversing direction and the media carrier moves relatively to the at least one exposure head along a direction that is not parallel to the traversing direction.

10. The imaging apparatus of claim 9 wherein the controller causes the at least one exposure head to move along the traversing direction concurrently as the media carrier moves relatively to the at least one exposure head.

11. The imaging apparatus of claim 9 wherein the at least one exposure head images one or more bands on the media, the one or more bands extending in a skewed orientation with respect to both the traversing direction and the direction that is not parallel to the traversing direction.

12. The imaging apparatus of claim 4 wherein the mechanism moves the at least one exposure head along a traversing direction and the media carrier moves relatively to the at least one exposure head along a direction that is transverse to the traversing direction.

13. The imaging apparatus of claim 4 wherein the mechanism comprises one or more leadscrews, and the media carrier moves transversely to an axis of the one or more lead screws.

14. The imaging apparatus of claim 4 wherein the mechanism moves the at least one exposure head along a traversing direction and the at least one exposure head images one or more bands on the media, the one or more bands extending in a direction that is skewed with respect to the traversing direction.

15. The imaging apparatus of claim 4 wherein the media is secured to the media support.

16. The imaging apparatus of claim 4 wherein the mechanism moves the at least one exposure head along a traversing direction and the media moves relatively to the at least one exposure head along a direction that is not parallel to the traversing direction.

17. The imaging apparatus of claim 16 wherein the controller causes the at least one of the exposure heads to move along the traversing direction concurrently as the media moves relatively to the at least one exposure head.

18. The imaging apparatus of claim 4 wherein the media carrier comprises a cylindrical drum.

19. The imaging apparatus of claim 4 comprising a flatbed imaging system.

20. An imaging apparatus comprising:
a media carrier;
a plurality of exposure heads spaced apart from one another along a traversing direction, at least one exposure head disposed to direct imaging beams to form bands on media supported on the media carrier, wherein the bands extend in a direction that is not parallel to the traversing direction; and
an adjustable mechanism for moving the exposure heads relative to each other to change a spacing therebetween while each exposure head is concurrently moving.

21. The imaging apparatus of claim 20 wherein the each exposure head is disposed to image a portion of a single sheet of media supported on the media carrier.

22. The imaging apparatus of claim 20 wherein each exposure head is disposed to image one of at least two sheets of media supported on the media carrier.

23. The imaging apparatus of claim 20 wherein the adjustable mechanism changes the spacing between the exposure heads along the traversing direction.

24. The imaging apparatus of claim 20 wherein the media carrier moves relatively to the at least one exposure head along a path that is not parallel to the traversing direction.

25. The imaging apparatus of claim 20 wherein the media moves relatively to the at least one exposure head along a path that is not parallel to the traversing direction.

26. The imaging apparatus of claim 20 wherein the media is secured to the media carrier.

27. The imaging apparatus of claim 20 wherein the adjustable mechanism changes the spacing between the exposure heads while each exposure head is concurrently imaging corresponding portions of the media supported on the media carrier.

28. A method for imaging comprising:
supporting a media on a media carrier;
imaging the media with a plurality of exposure heads spaced apart from one another, wherein each exposure head is disposed to image corresponding portions of the media supported on the media carrier; and
adjusting a traverse speed of at least one exposure head to change a spacing between the exposure heads while the exposure heads are concurrently imaging the corresponding portions of the media supported on the media carrier.

29. The method of claim 28 comprising moving the exposure heads along a traversing direction while the exposure heads concurrently image the corresponding portions of the media supported on the media carrier, wherein the traverse speed of the at least one exposure head is adjusted to change a spacing between the exposure heads along the traversing direction.

30. The method of claim 29 comprising moving the media carrier relative to at least one exposure head while the at least one exposure head is moved along the traversing direction, wherein the media carrier moves relative to at least one exposure head in a direction that is not parallel to the traversing direction.

31. The method of claim 28 comprising moving the media carrier relative to at least one exposure head while the at least one exposure head is directing imaging beams towards the media.

32. The method of claim 28 comprising moving the media relative to at least one exposure head while the at least one exposure head is directing imaging beams towards the media.

33. An imaging apparatus comprising:
a media carrier;
at least two exposure heads spaced apart from one another, the exposure heads comprising a plurality of channels disposed to emit beams to image media secured on the media carrier;
a mechanism for moving the exposure heads relative to each other to change a spacing therebetween while each exposure head is concurrently imaging corresponding portions of the media secured on the media carrier; and
a speed controller connected to the mechanism for moving to allow a traverse speed of at least one of the exposure heads to be controlled sufficiently precisely to adjust a position of a last channel to within less than one beam width.

* * * * *